United States Patent
Kotani

(10) Patent No.: US 9,997,612 B2
(45) Date of Patent: Jun. 12, 2018

(54) COMPOUND SEMICONDUCTOR DEVICE AND METHOD OF MANUFACTURING THE SAME

(71) Applicant: FUJITSU LIMITED, Kawasaki-shi, Kanagawa (JP)

(72) Inventor: Junji Kotani, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days. days.

(21) Appl. No.: 15/487,660

(22) Filed: Apr. 14, 2017

(65) Prior Publication Data

US 2017/0222016 A1 Aug. 3, 2017

Related U.S. Application Data

(62) Division of application No. 14/747,060, filed on Jun. 23, 2015, now Pat. No. 9,653,590.

(30) Foreign Application Priority Data

Jun. 24, 2014 (JP) .................................. 2014-129563

(51) Int. Cl.
*H01L 29/66* (2006.01)
*H01L 29/20* (2006.01)
(Continued)

(52) U.S. Cl.
CPC .... *H01L 29/66462* (2013.01); *H01L 21/0254* (2013.01); *H01L 21/0262* (2013.01);
(Continued)

(58) Field of Classification Search
None
See application file for complete search history.

(56) References Cited

U.S. PATENT DOCUMENTS

| 4,905,061 A | 2/1990 | Ohmuro et al. |
| 2010/0148153 A1* | 6/2010 | Hudait .................. H01L 29/365 257/24 |

(Continued)

FOREIGN PATENT DOCUMENTS

| JP | 1-96964 | 4/1989 |
| JP | 5-166724 A | 7/1993 |

(Continued)

OTHER PUBLICATIONS

USPTO, (Moore) Notice of Allowance and Notice of Allowability, dated Jan. 17, 2017, in parent U.S. Appl. No. 14/747,060 [allowed].

(Continued)

*Primary Examiner* — Whitney T Moore
(74) *Attorney, Agent, or Firm* — Fujitsu Patent Center

(57) ABSTRACT

A compound semiconductor device includes: a semiconductor substrate; a channel layer over the semiconductor substrate; a carrier supply layer over the channel layer; and a gate electrode, a source electrode and a drain electrode above the carrier supply layer. The semiconductor substrate includes an impurity-containing region containing an impurity, the impurity forms a level lower than a lower edge of a conduction band of silicon by 0.25 eV or more, the impurity forms the level higher than an upper edge of a valence band of silicon.

16 Claims, 11 Drawing Sheets

(51) Int. Cl.
*H01L 21/02* (2006.01)
*H01L 29/778* (2006.01)

(52) U.S. Cl.
CPC .. *H01L 21/02378* (2013.01); *H01L 21/02381* (2013.01); *H01L 21/02458* (2013.01); *H01L 29/2003* (2013.01); *H01L 29/7787* (2013.01)

(56) References Cited

U.S. PATENT DOCUMENTS

| | | |
|---|---|---|
| 2010/0301358 A1 | 12/2010 | Shibata |
| 2014/0091314 A1 | 4/2014 | Ishiguro et al. |
| 2015/0069407 A1* | 3/2015 | Matsubayashi ... H01L 29/66462 257/76 |
| 2015/0084163 A1 | 3/2015 | Shikauchi |
| 2016/0043178 A1* | 2/2016 | Liu ..................... C30B 25/183 257/76 |

FOREIGN PATENT DOCUMENTS

| | | |
|---|---|---|
| JP | 8-335695 A | 12/1996 |
| JP | 2009-026975 | 2/2009 |
| JP | 2012-186267 | 9/2012 |
| JP | 2014-72431 | 4/2014 |

OTHER PUBLICATIONS

USPTO, (Moore) Final Rejection, dated Oct. 6, 2016, in parent U.S. Appl. No. 14/747,060 [allowed].
USPTO, (Moore) Non-Final Rejection, dated May 17, 2016, in parent U.S. Appl. No. 14/747,060 [allowed].
USPTO, (Moore) Restriction Requirement, dated Mar. 22, 2016, in parent U.S. Appl. No. 14/747,060 [allowed].
Japanese Office Action dated May 30, 2017 for corresponding Japanese Patent Application No. 2014-129563, with Partial English Translation, 9 pages.
JPOA—Office Action of Japanese Patent Application No. 2014-129563 dated Aug. 8, 2017, with full English translation of the Office Action.

* cited by examiner

COMPOUND SEMICONDUCTOR DEVICE AND METHOD OF MANUFACTURING THE SAME

CROSS-REFERENCE TO RELATED APPLICATION

This application is a divisional of application Ser. No. 14/747,060, filed Jun. 23, 2015, which is based upon and claims the benefit of priority of the prior Japanese Patent Application No. 2014-129563, filed on Jun. 24, 2014, the entire contents of which are incorporated herein by reference.

FIELD

The embodiments discussed herein are directed to a compound semiconductor device, a method of manufacturing the same and the like.

BACKGROUND

A nitride semiconductor has characteristics such as high saturation electron velocity and wide band gap. Thus, various studies have been conducted regarding an application of the nitride semiconductor to a semiconductor device with high withstand voltage and high output power, by utilizing these characteristics. For example, a band gap of GaN being one kind of the nitride semiconductor is 3.4 eV, which is larger than a band gap of Si (1.1 eV) and a band gap of GaAs (1.4 eV). Accordingly, GaN has high breakdown electric field intensity, and thus is quite promising as a material of a semiconductor device for power supply which obtains high voltage operation and high output power.

As a semiconductor device with a nitride semiconductor, there have been made numerous reports on a field effect transistor, particularly a high electron mobility transistor (HEMT). For example, an AlGaN/GaN-HEMT using GaN as a channel layer and AlGaN as a carrier supply layer is attracting attention among GaN-based HEMTs. A strain resulted from a lattice mismatch between GaN and AlGaN occurs in AlGaN in the AlGaN/GaN-HEMT. Then, two-dimensional electron gas (2DEG) of high concentration is obtained from piezoelectric polarization caused by the strain and spontaneous polarization of AlGaN. Accordingly, the AlGaN/GaN-HEMT is expected as a high efficiency switching element and a high-withstand-voltage electric power device for electric vehicle, or the like.

However, it is quite difficult to form a GaN substrate with excellent crystallinity. Thus, conventionally, a GaN layer and an AlGaN layer and the like are formed mainly over a silicon substrate, a sapphire substrate or a silicon carbide substrate through heteroepitaxial growth. It is easy to obtain, in particular, a silicon substrate with large diameter and high quality at a low cost. Accordingly, a research regarding a structure in which a channel layer and a carrier supply layer are grown over a silicon substrate has been extensively conducted.

However, it is difficult to suppress a leak current that flows between a drain electrode and the semiconductor substrate in a conventional GaN-based HEMT with a semiconductor substrate such as a silicon substrate. A maximum operating voltage (maximum operating withstand voltage) of the HEMT is limited due to the leak current.

Patent Literature 1: Japanese Laid-Open Patent Publication No. 2009-026975

Patent Literature 2: Japanese Laid-Open Patent Publication No. 01-096964

SUMMARY

According to an aspect of the embodiments, a compound semiconductor device includes: a semiconductor substrate; a channel layer over the semiconductor substrate; a carrier supply layer over the channel layer; and a gate electrode, a source electrode and a drain electrode over the carrier supply layer. The semiconductor substrate includes an impurity-containing region containing an impurity, the impurity forms a level lower than a lower edge of a conduction band of silicon by 0.25 eV or more, the impurity forms the level higher than an upper edge of a valence band of silicon.

According to another aspect of the embodiments, a method of manufacturing a compound semiconductor device includes: forming an impurity-containing region containing an impurity in a semiconductor substrate, the impurity forming a level lower than a lower edge of a conduction band of silicon by 0.25 eV or more, the impurity forming the level higher than an upper edge of a valence band of silicon; forming a channel layer over a semiconductor substrate; forming a carrier supply layer over the channel layer; and forming a gate electrode, a source electrode and a drain electrode over the carrier supply layer.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

The inventor of the present application conducted a study regarding a cause of the leak current flowing between the drain electrode and the semiconductor substrate in the conventional GaN-based HEMT. As a result, it was clarified that a depletion layer reaches an inside of the semiconductor substrate through the nitride semiconductor layer such as the carrier supply layer and the channel layer due to a high voltage applied to the drain electrode, resulting in that an electron-hole pair is generated in the semiconductor substrate. In particular, when silicon or silicon carbide, which has a small band gap, is used as the semiconductor substrate, the electron-hole pair is easily generated. Further, when the GaN-based HEMT is used for a power device which performs a high-current operation, a temperature of the GaN-based HEMT exceeds 100° C., so that the generation of the electron-hole pair is significantly facilitated due to thermal excitation. Further, the electron-hole pair is separated by an internal electric field, and the electron flows into the nitride semiconductor layer. The leak current is generated in accordance with the transfer of the electron.

The inventor further conducted earnest studies in order to suppress the leak current based on the above-described new findings. As a result, it was found out that a prompt recombination of the electron-hole pair in the semiconductor substrate can be caused by previously making a predetermined impurity to be contained in a semiconductor substrate, to thereby suppress the transfer of the electrons into the nitride semiconductor layer.

Hereinafter, embodiments will be described while referring to the attached drawings.

(First Embodiment)

Figure 1A:
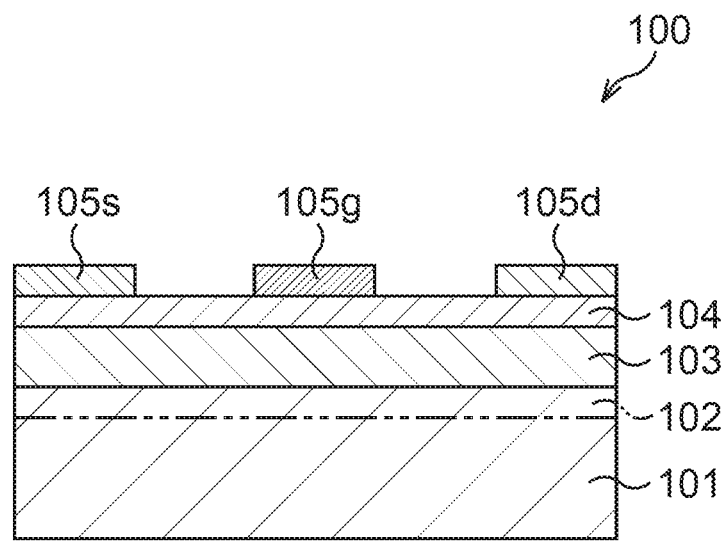
FIG. 1A and FIG. 1B are diagrams each illustrating a compound semiconductor device according to a first embodiment.
Figure 1B:
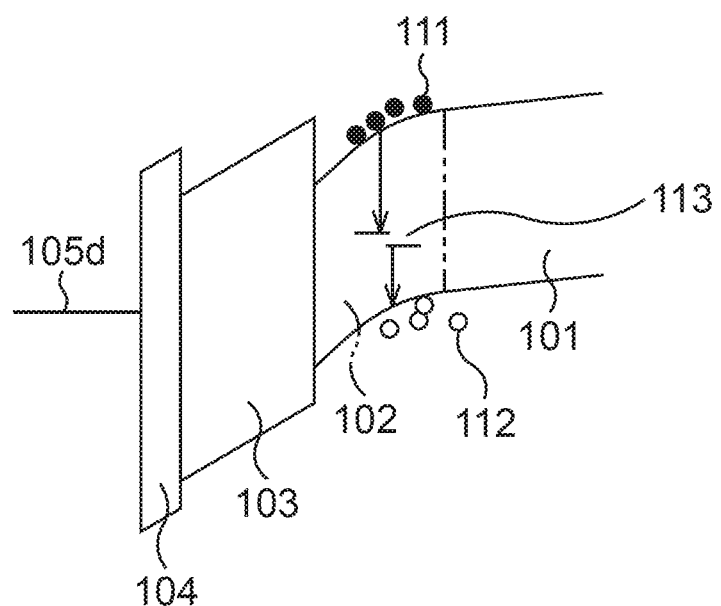

First, a first embodiment will be described. The first embodiment is an example of a GaN-based HEMT. FIG. 1A and FIG. 1B are diagrams each illustrating a compound semiconductor device according to the first embodiment. FIG. 1A briefly illustrates a cross-sectional structure, and FIG. 1B briefly illustrates a band structure.

As illustrated in FIG. 1A, a compound semiconductor device 100 according to the first embodiment includes a semiconductor substrate 101, a channel layer 103 over the semiconductor substrate 101, and a carrier supply layer 104 over the channel layer 103. The semiconductor substrate 101 includes an impurity-containing region 102 containing an impurity. A level formed by the impurity is lower than a lower edge of a conduction band of silicon by 0.25 eV or more, and is higher than an upper edge of a valence band of silicon. The compound semiconductor device 100 also includes a gate electrode 105g, a source electrode 105s and a drain electrode 105d over the carrier supply layer 104.

A band structure in a stack direction including the drain electrode 105d in the first embodiment is briefly illustrated in FIG. 1B. In the first embodiment, when a positive high voltage is applied to the drain electrode 105d, a depletion layer reaches an inside of the semiconductor substrate 101, and an electron 111 and a hole 112 are generated in the semiconductor substrate 101, as illustrated in FIG. 1B. Specifically, an electron-hole pair is generated in the semiconductor substrate 101. In the first embodiment, the semiconductor substrate 101 includes the impurity-containing region 102, and the level formed by the impurity contained in the impurity-containing region 102 is lower than the lower edge of the conduction band of silicon by 0.25 eV or more, and is higher than the upper edge of the valence band of silicon. The impurity forms a deep level in the semiconductor substrate 101, so that a recombination center 113 which makes an electron and a hole disappear exists in the semiconductor substrate 101. Thus, a recombination of the electron 111 and the hole 112 in the semiconductor substrate 101 occurs quickly because of an influence of the impurity, as illustrated in FIG. 1B. Specifically, the impurity in the impurity-containing region 102 shortens a carrier life time. Thus, the electron disappears before the electron-hole pair is separated. For example, a carrier life time in the semiconductor substrate 101 is $1\times10^{-9}$ seconds or less. Thus, according to the first embodiment, it is possible to suppress a leak current due to the generation of the electron 111 and the hole 112.

If the difference between the level formed by the impurity contained in the impurity-containing region 102 and the lower edge of the conduction band of silicon is less than 0.25 eV, the impurity functions as a donor, which may increase the leak current.

(Second Embodiment)

Figure 2A:
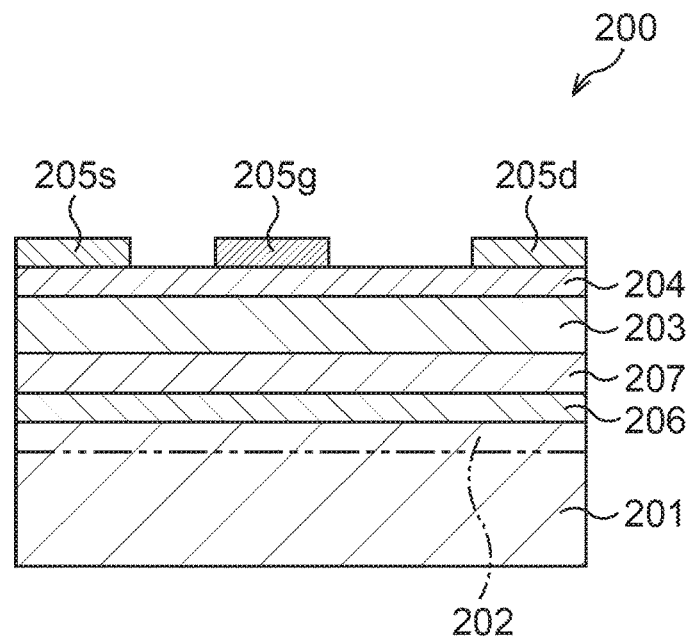
FIG. 2A and FIG. 2B are diagrams each illustrating a compound semiconductor device according to a second embodiment.
Figure 2B:
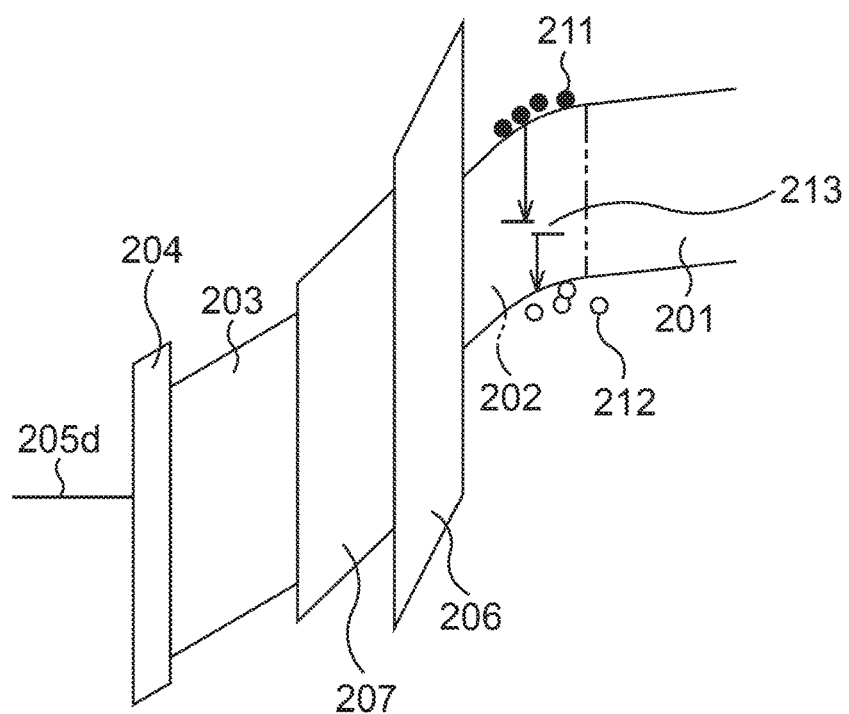

Next, a second embodiment will be described. The second embodiment is an example of a GaN-based HEMT. FIG. 2A and FIG. 2B are diagrams each illustrating a compound semiconductor device according to the second embodiment. FIG. 2A briefly illustrates a cross-sectional structure, and FIG. 2B briefly illustrates a band structure.

As illustrated in FIG. 2A, a compound semiconductor device 200 according to the second embodiment includes a semiconductor substrate 201, a channel layer 203 over the semiconductor substrate 201, and a carrier supply layer 204 over the channel layer 203. The semiconductor substrate 201 includes an impurity-containing region 202 containing an impurity. A level formed by the impurity is lower than the lower edge of the conduction band of silicon by 0.25 eV or more, and is higher, desirably by 0.25 eV or more, than the upper edge of the valence band of silicon. The compound semiconductor device 200 also includes an initial layer 206 between the semiconductor substrate 201 and the channel layer 203, and a buffer layer 207 between the initial layer 206 and the channel layer 203. The compound semiconductor device 200 also includes a gate electrode 205g, a source electrode 205s and a drain electrode 205d over the carrier supply layer 204.

The semiconductor substrate 201 is a silicon substrate whose upper surface has the Miller index of (111), for example. The semiconductor substrate 201 may also be a silicon carbide substrate or the like. The impurity contained in the impurity-containing region 202 is, for example, Fe, C, Mg, Au or B, or any combination thereof. An average impurity concentration of a region from the upper surface of the semiconductor substrate 201 to a plane whose depth from the upper surface is at least 50 nm is $1\times10^{18}$ cm$^{-3}$ or more, for example, and the region corresponds to the impurity-containing region 202.

The initial layer 206 is, for example, an AlN layer having a thickness of about 200 nm. The buffer layer 207 is, for example, an AlGaN layer. The channel layer 203 is, for example, an i-GaN layer having a thickness of about 1 μm, and in which an intentional doping of impurity is not conducted. The carrier supply layer 204 is, for example, an n-type n-Al$_{0.2}$Ga$_{0.8}$N layer having a thickness of about 20 nm. In the carrier supply layer 204, for example, Si is doped as an n-type impurity in a concentration of about $5\times10^{18}$ cm$^{-3}$. Each of the source electrode 205s and the drain electrode 205d includes, for example, a Ti film and an Al film thereon, and is in ohmic contact with the carrier supply layer 204 and the channel layer 203. The gate electrode 205g includes, for example, a Ni film and an Au film thereon, and is in Schottky contact with the carrier supply layer 204 and the channel layer 203.

A band structure in a stack direction including the drain electrode 205d in the second embodiment is briefly illustrated in FIG. 2B. In the second embodiment, when a positive high voltage is applied to the drain electrode 205d, a depletion layer reaches an inside of the semiconductor substrate 201, and an electron 211 and a hole 212 are generated in the semiconductor substrate 201, as illustrated in FIG. 2B. Specifically, an electron-hole pair is generated in the semiconductor substrate 201. In the second embodiment, the semiconductor substrate 201 includes the impurity-containing region 202, and the level formed by the impurity contained in the impurity-containing region 202 is lower than the lower edge of the conduction band of silicon by 0.25 eV or more, and is higher than the upper edge of the valence band of silicon. The impurity forms a deep level in the semiconductor substrate 201, so that a recombination center 213 which makes an electron and a hole disappear exists in the semiconductor substrate 201. Thus, a recombination of the electron 211 and the hole 212 in the semiconductor substrate 201 occurs quickly because of an influence of the impurity, as illustrated in FIG. 2B. Specifically, the impurity in the impurity-containing region 202 shortens a carrier life time. Thus, the electron disappears before the electron-hole pair is separated. For example, a carrier life time in the semiconductor substrate 201 is $1\times10^{-9}$ seconds or less. Thus, also according to the second embodiment, it is possible to suppress a leak current due to the generation of the electron 211 and the hole 212.

If the difference between the level formed by the impurity contained in the impurity-containing region 202 and the lower edge of the conduction band of silicon is less than 0.25 eV, the impurity functions as a donor, resulting in that the recombination center 213 may not be obtained, and the leak current may increase. Further, when the difference between the level formed by the impurity contained in the impurity-containing region 202 and the upper edge of the valence band of silicon is less than 0.25 eV, the impurity functions as an acceptor, resulting in that a sufficient recombination center 213 may not be obtained.

(Third Embodiment)

Figure 3:
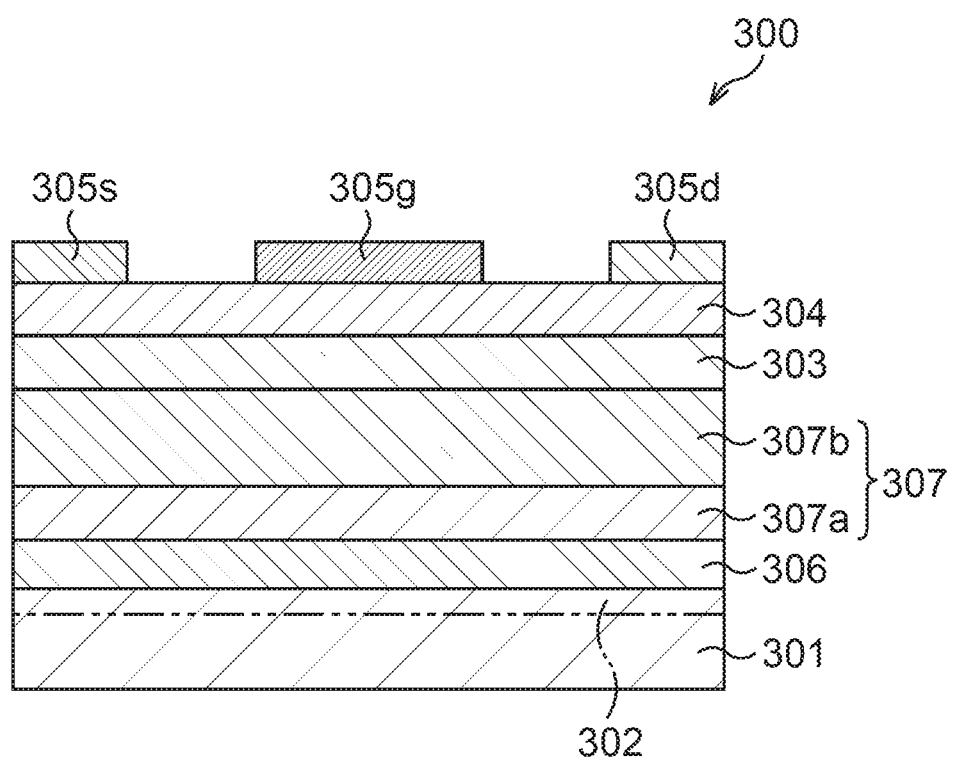
FIG. 3 is a sectional view illustrating a compound semiconductor device according to a third embodiment.

Next, a third embodiment will be described. The third embodiment is an example of a GaN-based HEMT. FIG. 3 is a sectional view illustrating a compound semiconductor device according to the third embodiment.

As illustrated in FIG. 3, a compound semiconductor device 300 according to the third embodiment includes a semiconductor substrate 301, a channel layer 303 over the semiconductor substrate 301, and a carrier supply layer 304 over the channel layer 303. The semiconductor substrate 301 includes an impurity-containing region 302 containing an impurity. The compound semiconductor device 300 also includes an initial layer 306 between the semiconductor substrate 301 and the channel layer 303, and a buffer layer 307 between the initial layer 306 and the channel layer 303. The compound semiconductor device 300 also includes a gate electrode 305g, a source electrode 305s and a drain electrode 305d over the carrier supply layer 304.

The semiconductor substrate 301 is a silicon substrate whose upper surface has the Miller index of (111), for example. The impurity contained in the impurity-containing region 302 is Fe, for example. An average impurity concentration of a region from the upper surface of the semiconductor substrate 301 to a plane whose depth from the upper surface is at least 50 nm is $1\times10^{18}$ cm$^{-3}$ or more, for example, and the region corresponds to the impurity-containing region 302. The concentration of Fe is about $1\times10^{19}$ cm$^{-3}$ at the upper surface of the semiconductor substrate 301, and is about $1\times10^{17}$ cm$^{-3}$ in a region having a depth of about 100 nm from the upper surface. The level formed by Fe is lower than the lower edge of the conduction band of silicon by 0.25 eV or more, and is higher than the upper edge of the valence band of silicon by 0.25 eV or more.

The initial layer 306 is, for example, an AlN layer having a thickness of about 200 nm. The buffer layer 307 includes a buffer layer 307a and a buffer layer 307b thereon. The buffer layer 307a is, for example, an $Al_{0.4}Ga_{0.6}N$ layer. The buffer layer 307b is a superlattice buffer layer in which an AlN layer and an $Al_{0.2}Ga_{0.8}N$ layer are repeatedly stacked about 80 periods. For example, a thickness of the AlN layer and a thickness of the $Al_{0.2}Ga_{0.8}N$ layer in one period the superlattice buffer layer are 1.5 nm and 20 nm, respectively. The thickness of the AlN layer is desirably 2 nm or less in order to avoid a reduction in a withstand voltage caused by a generation of a residual electron. The channel layer 303 is, for example, an i-GaN layer having a thickness of about 1 μm, and in which an intentional doping of impurity is not conducted. The carrier supply layer 304 is, for example, an n-type n-$Al_{0.2}Ga_{0.8}N$ layer having a thickness of about 20 nm. In the carrier supply layer 304, for example, Si is doped as an n-type impurity in a concentration of about $5\times10^{18}$ cm$^{-3}$. Each of the source electrode 305s and the drain electrode 305d includes, for example, a Ti film and an Al film thereon, and is in ohmic contact with the carrier supply layer 304 and the channel layer 303. The gate electrode 305g includes, for example, a Ni film and an Au film thereon, and is in Schottky contact with the carrier supply layer 304 and the channel layer 303.

A band structure in a stack direction including the drain electrode 305d in the third embodiment is similar to the band structure in the stack direction including the drain electrode 205d in the second embodiment. Therefore, when a positive high voltage is applied to the drain electrode 305d, and an electron-hole pair is generated, it is possible to suppress a leak current due to the generation of the electron-hole pair.

Next, a method of manufacturing the compound semiconductor device according to the third embodiment will be described. FIG. 4A to FIG. 4E are sectional views illustrating the method of manufacturing the compound semiconductor device according to the third embodiment in order of processes.

Figure 4A:
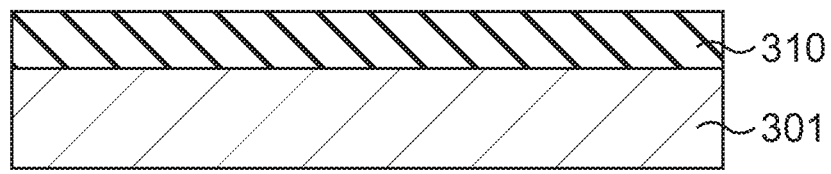
FIG. 4A to FIG. 4E are sectional views illustrating a method of manufacturing the compound semiconductor device according to the third embodiment in order of processes.

First, as illustrated in FIG. 4A, a protective film 310 is formed on the semiconductor substrate 301. The protective film 310 is, for example, a silicon oxide film having a thickness of about 20 nm. The protective film 310 may be formed through, for example, heat treatment in an atmosphere of $O_2$ gas, namely, thermal oxidation. A temperature for the heat treatment is 950° C., for example. The protective film 310 may be formed through a chemical vapor deposition (CVD) method or the like.

Figure 4B:
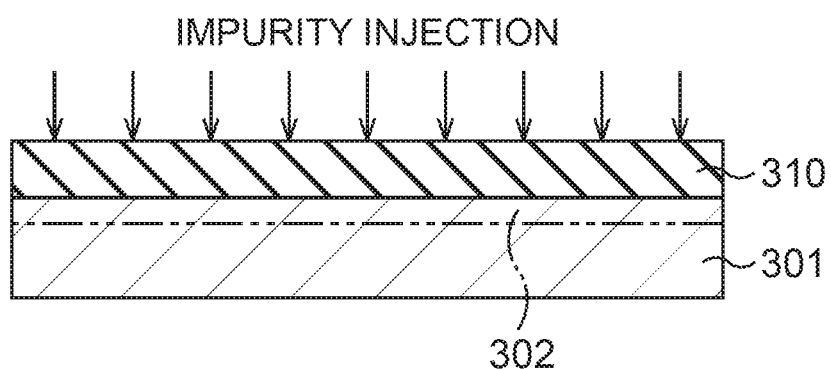

Then, as illustrated in FIG. 4B, an ion implantation of Fe is performed into the semiconductor substrate 301 through the protective film 310. A concentration of Fe is set to about $1\times10^{19}$ cm$^{-3}$ at the upper surface of the semiconductor substrate 301, and is set to about $1\times10^{17}$ cm$^{-3}$ in a region having a depth of about 100 nm from the upper surface. Thereafter, annealing is performed so that a damage of crystal due to the ion implantation is recovered. For example, this annealing is conducted in an atmosphere of $N_2$, and a temperature and a period of time for the annealing are set to about 950° C. and about 30 minutes, respectively.

Figure 4C:
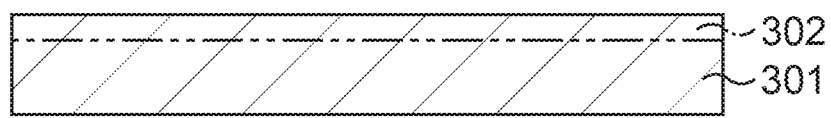

Subsequently, the protective film 310 is removed, as illustrated in FIG. 4C. The protective film 310 may be removed within about 5 minutes by immersing the semiconductor substrate 301 together with the protective film 310, in a hydrofluoric acid solution which is diluted to about 10% by pure water.

Figure 4D:
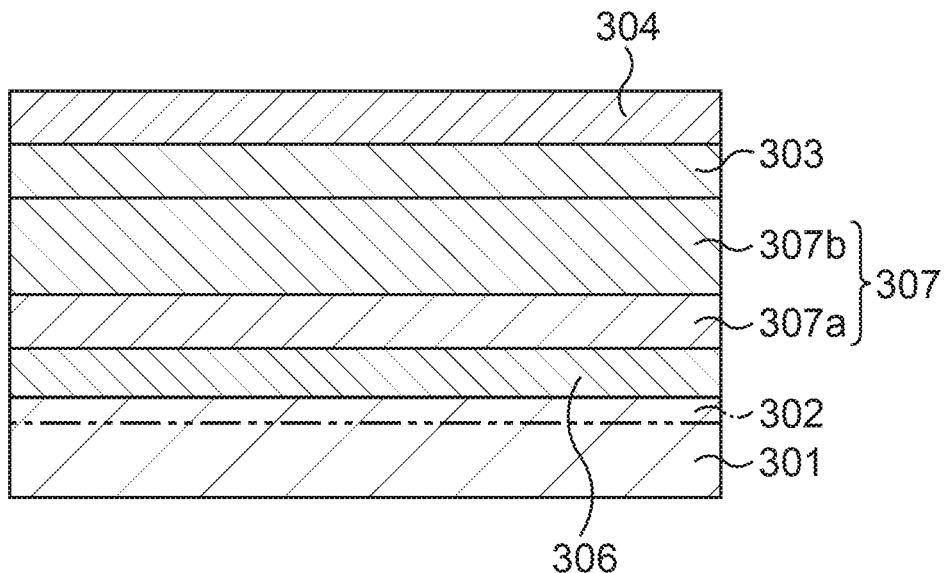

Then, as illustrated in FIG. 4D, the initial layer 306, the buffer layer 307a, the buffer layer 307b, the channel layer 303 and the carrier supply layer 304 are formed over the semiconductor substrate 301. The initial layer 306, the buffer layer 307a, the buffer layer 307b, the channel layer 303 and the carrier supply layer 304 may be formed through, for example, a crystal growth method such as a metal organic chemical vapor deposition (MOCVD) method or a molecular beam epitaxy (MBE) method. A mixed gas of trimethylaluminum (TMA) gas, trimethylgallium (TMG) gas, and ammonia ($NH_3$) gas is used as the source gas.

In the formation of the initial layer 306 (AlN layer), for example, a V/III ratio is set to about 1000 to 2000, a growth temperature is set to about 1000° C., and a pressure is set to about 50 mbar. It is preferable to select a condition under which an amount of C impurity to be taken into the initial layer 306 is small. In the formation of the buffer layer 307a ($Al_{0.4}Ga_{0.6}N$ layer), for example, a V/III ratio is set to about 100 to 300, a growth temperature is set to about 1000° C., and a pressure is set to about 50 mbar. The reason why the V/III ratio in the formation of the buffer layer 307a is set to be lower than that in the formation of the initial layer 306, is for obtaining a high flatness.

In the formation of the buffer layer 307b (superlattice buffer layer), a formation of AlN layer and a formation of $Al_{0.2}Ga_{0.8}N$ layer are repeatedly conducted about 80 times. In the formation of the AlN layer and the formation of the $Al_{0.2}Ga_{0.8}N$ layer, for example, a growth temperature is set to about 1020° C., a pressure is set to about 50 mbar, and a switching of source gas is conducted. As described above, the common growth temperature and pressure are employed in the formation of the AlN layer and the formation of the $Al_{0.2}Ga_{0.8}N$ layer, for example.

In the formation of the channel layer 303 (i-GaN layer), for example, a V/III ratio is set to about 600, a growth temperature is set to about 1000° C., and a pressure is set to about 200 mbar. In the formation of the carrier supply layer 304 (n-AlGaN layer), a V/III ratio is set to 3000 or more, a growth temperature is set to about 1040° C., and a pressure is set to about 400 mbar. It is preferable to select a condition under which a C concentration is lowered, in order to suppress a current collapse phenomenon. When an n-type compound semiconductor layer (the carrier supply layer 304, for example) is grown, for example, $SiH_4$ gas containing Si is added to the mixed gas at a predetermined flow rate, thereby doping Si in the compound semiconductor layer.

Figure 4E:
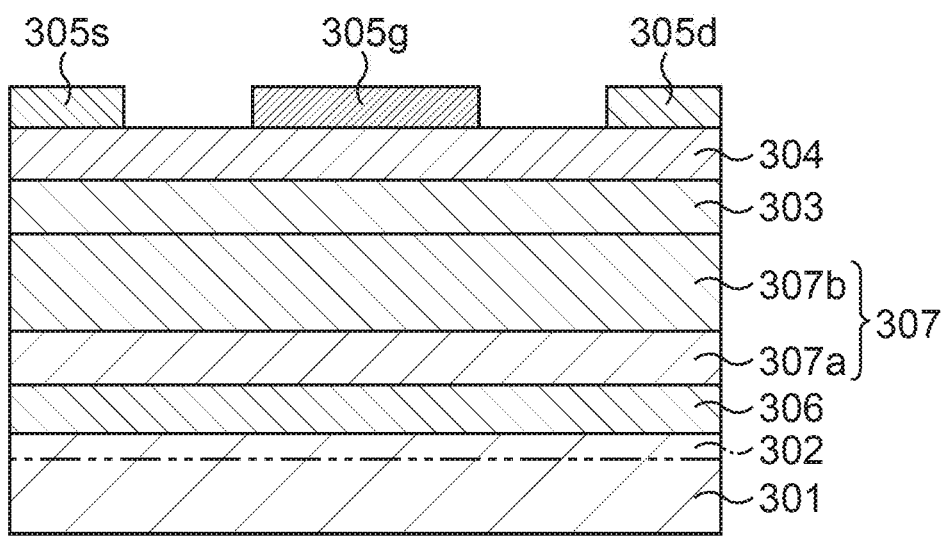

After the formation of the carrier supply layer 304, an element isolation region which demarcates an element region is formed. In the formation of the element isolation region, for example, a pattern of photoresist which exposes a region on which the element isolation region is to be formed, is formed on the carrier supply layer 304, and an ion implantation of Ar or the like is performed using this pattern as a mask. A dry etching may be performed in which a chlorine gas is used with this pattern employed as an etching mask. Thereafter, the source electrode 305s and the drain electrode 305d are formed on the carrier supply layer 304 within the element region, as illustrated in FIG. 4E. The source electrode 305s and the drain electrode 305d may be formed through a lift-off method, for example. Specifically, a pattern of photoresist exposing a region on which the source electrode 305s is to be formed and a region on which the drain electrode 305d is to be formed, and covering the other region, is formed, a metal film is formed by a vapor deposition method using this pattern as a growth mask, and this pattern is removed together with the metal film thereon.

In the formation of the metal film, for example, a Ti film having a thickness of about 100 nm is formed, and an Al film having a thickness of about 300 nm is formed on the Ti film. Then, for example, heat treatment (rapid thermal annealing (RTA), for example) is conducted in an atmosphere of $N_2$ at 400° C. to 1000° C. (600° C., for example), to thereby obtain an ohmic contact. The gate electrode 305g is formed on the carrier supply layer 304 between the source electrode 305s and the drain electrode 305d. The gate electrode 305g may be formed through the lift-off method, for example. Specifically, a pattern of photoresist exposing a region on which the gate electrode 305g is to be formed, is formed, a metal film is formed through the vapor deposition method using this pattern as a growth mask, and this pattern is removed together with the metal film thereon. In the formation of the metal film, for example, a Ni film having a thickness of about 50 nm is formed, and an Au film having a thickness of about 300 nm is formed on the Ni film.

Subsequently, a protective film, a wiring and the like are formed according to need, thereby completing the compound semiconductor device.

Figure 5:
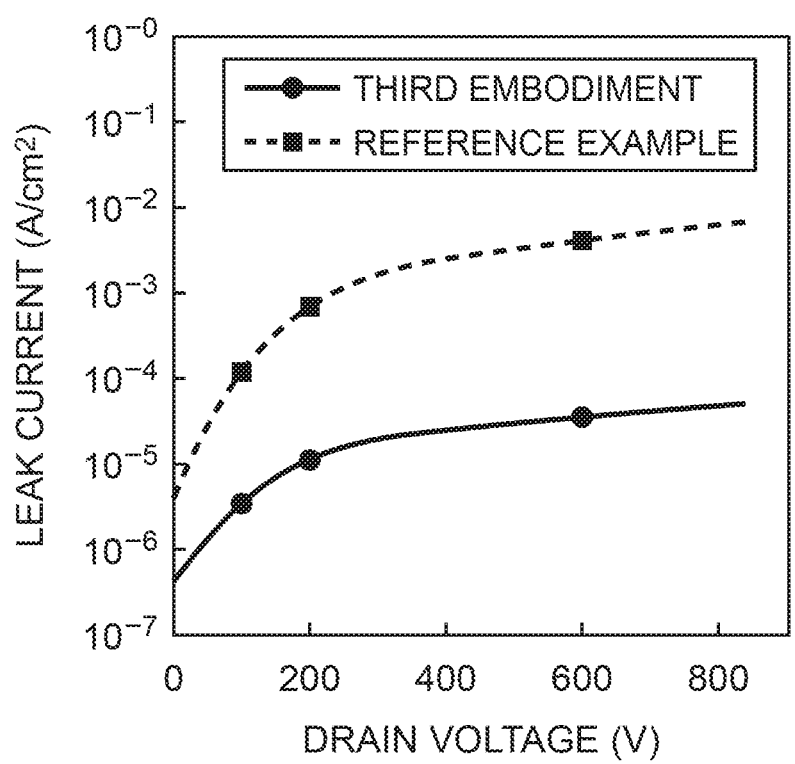
FIG. 5 is a view illustrating a relation between a drain voltage and a leak current.

When the inventor manufactured a compound semiconductor device according to the third embodiment, and measured a leak current under various drain voltages, a result presented in FIG. 5 was obtained. FIG. 5 also illustrates a measured result of a leak current of a reference example in which the formation of the impurity-containing region 302 is omitted. As illustrated in FIG. 5, in the third embodiment including the impurity-containing region 302, it was possible to greatly decrease the leak current.

The inventor also conducted verification regarding a change in crystallinity caused by an ion implantation of impurity. Here, an ion implantation of Fe was conducted according to the third embodiment, a protective film was removed, a GaN layer was then grown, and a crystallinity of the GaN layer was measured by an X-ray rocking curve method. Further, a similar measurement was conducted also in a case where an ion implantation of Au, instead of Fe, was performed. Furthermore, a similar measurement was conducted also in a case where the ion implantation of impurity was not performed. Results thereof are presented in Table 1.

TABLE 1

| IMPURITY | FULL WIDTH AT HALF MAXIMUM OF ROCKING CURVE (SEC) | |
|---|---|---|
| | TILT | TWIST |
| Fe | 557 | 1263 |
| Au | 540 | 1259 |
| None | 585 | 1396 |

As listed in Table 1, in each of the case where the ion implantation of Fe was performed and the case where the ion implantation of Au was performed, the crystallinity equal to or greater than that obtained in the case where the ion implantation of impurity was not performed, was obtained. Specifically, the reduction in the crystallinity caused by the ion implantation of impurity was not observed.

The introduction of Fe may be performed through a method other than the ion implantation. For example, a method may be employed in which a Fe film is formed on the semiconductor substrate 301 by the vapor deposition method or the like, and a thermal diffusion of Fe into the semiconductor substrate 301 is caused through heat treatment.

(Fourth Embodiment)

Next, a fourth embodiment will be described. In the fourth embodiment, a compound semiconductor device similar to that of the third embodiment is manufactured through a method which is different from the method illustrated in FIG. 4A to FIG. 4E. FIG. 6A to FIG. 6D are sectional views illustrating the method of manufacturing the compound semiconductor device according to the fourth embodiment in order of processes.

Figure 6A:
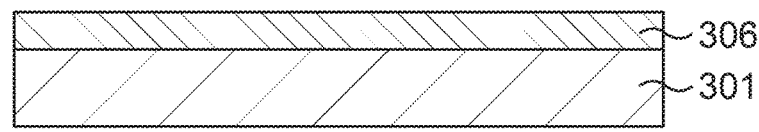
FIG. 6A to FIG. 6D are sectional views illustrating a method of manufacturing a compound semiconductor device according to a fourth embodiment in order of processes.
Figure 6B:
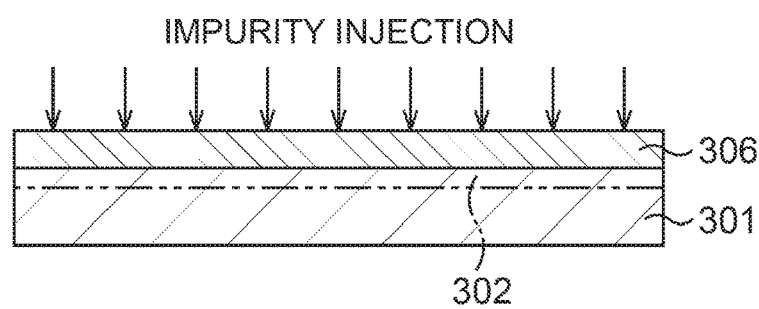
Figure 6C:
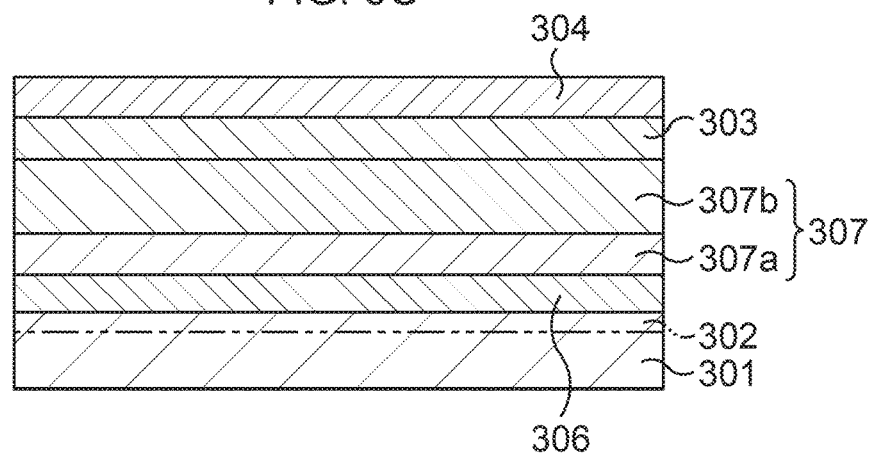
Figure 6D:
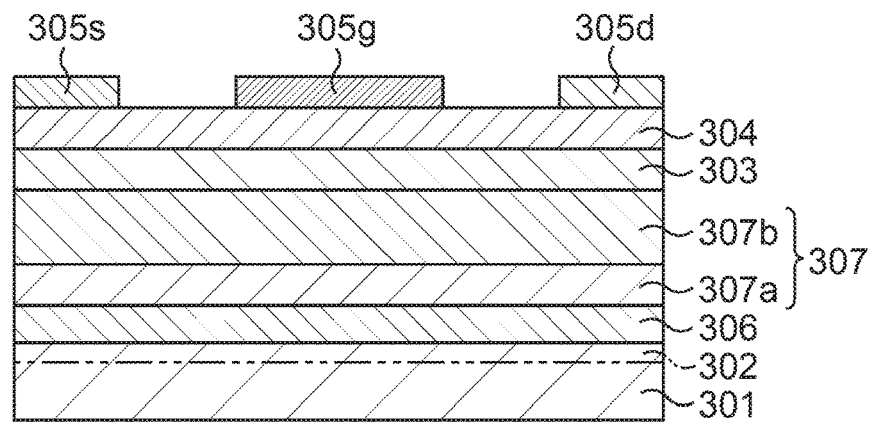

In the fourth embodiment, the initial layer 306 is first formed on the semiconductor substrate 301, as illustrated in FIG. 6A. The initial layer 306 may be formed through the crystal growth method such as, for example, the MOCVD method or the MBE method. Then, as illustrated in FIG. 6B, an ion implantation of Fe is performed on the semiconductor substrate 301 through the initial layer 306. Thereafter, annealing is performed so that a damage of crystal due to the ion implantation is recovered. Subsequently, as illustrated in FIG. 6C, the buffer layer 307a, the buffer layer 307b, the channel layer 303 and the carrier supply layer 304 are formed over the initial layer 306. Then, the element isolation region is formed, and the source electrode 305s and the drain electrode 305d are formed, and then the gate electrode 305g is formed, as illustrated in FIG. 6D.

Subsequently, a protective film, a wiring and the like are formed according to need, thereby completing the compound semiconductor device.

The fourth embodiment can also obtain an effect similar to that of the third embodiment. According to the fourth embodiment, a deep level can be formed also in the initial layer 306, so that it is possible to further suppress the leak current. Further, it is possible to create a continuous impurity concentration profile through an interface between the initial layer 306 and the semiconductor substrate 301.

The semiconductor substrate 301 may also be a silicon carbide substrate or the like. The impurity contained in the impurity-containing region 302 may also be Fe, C, Mg, Au or B, or any combination thereof. The buffer layer 307b is not necessarily the superlattice buffer layer. For example, an AlGaN layer whose Al composition becomes lower as approaching closer to the channel layer 303 side, may also be used as the buffer layer 307b. In this case, the composition of Al at an interface between the buffer layer 307b and the buffer layer 307a is equal to or less than an Al composition of the buffer layer 307a, for example. The Al composition is changed in stages, for example. The initial layer 306 and the like may be formed using a GaN substrate, a sapphire substrate or the like as a growth substrate. In this case, for example, the growth substrate is removed after the formation of the source electrode 305s, the drain electrode 305d, and the gate electrode 305g and the like are completed, and then the semiconductor substrate 301 including the impurity-containing region 302 is attached.

(Fifth Embodiment)

Figure 7:
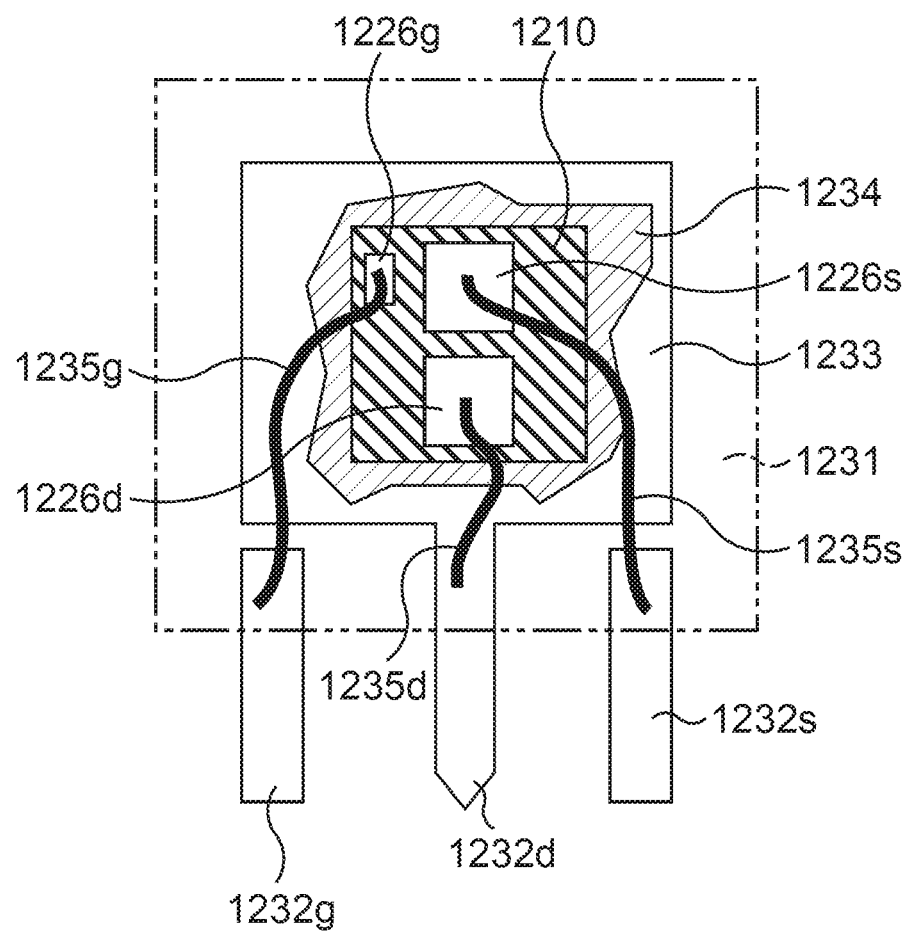
FIG. 7 is a view illustrating a discrete package according to a fifth embodiment.

Next, a fifth embodiment is described. The fifth embodiment relates to a discrete package of a compound semiconductor device which includes a GaN-based HEMT. FIG. 7 is a view illustrating the discrete package according to the fifth embodiment.

In the fifth embodiment, as illustrated in FIG. 7, a back surface of a HEMT chip 1210 of the compound semiconductor device according to any one of the first to third embodiments is fixed on a land (die pad) 1233, using a die attaching agent 1234 such as solder. One end of a wire 1235d such as an Al wire is bonded to a drain pad 1226d, to which the drain electrode 105d, 205d or 305d is connected, and the other end of the wire 1235d is bonded to a drain lead 1232d integral with the land 1233. One end of a wire 1235s such as an Al wire is bonded to a source pad 1226s, to which the source electrode 105s, 205s or 305s is connected, and the other end of the wire 1235s is bonded to a source lead 1232s separated from the land 1233. One end of a wire 1235g such as an Al wire is bonded to a gate pad 1226g, to which the gate electrode 105g, 205g or 305g is connected, and the other end of the wire 1235g is bonded to a gate lead 1232g separated from the land 1233. The land 1233, the HEMT chip 1210 and so forth are packaged with a molding resin 1231, so as to project outwards a portion of the gate lead 1232g, a portion of the drain lead 1232d, and a portion of the source lead 1232s.

The discrete package may be manufactured by the procedures below, for example. First, the HEMT chip 1210 is bonded to the land 1233 of a lead frame, using a die attaching agent 1234 such as solder. Next, with the wires 1235g, 1235d and 1235s, the gate pad 1226g is connected to the gate lead 1232g of the lead frame, the drain pad 1226d is connected to the drain lead 1232d of the lead frame, and the source pad 1226s is connected to the source lead 1232s of the lead frame, respectively, by wire bonding. The molding with the molding resin 1231 is conducted by a transfer molding process. The lead frame is then cut away.

(Sixth Embodiment)

Figure 8:
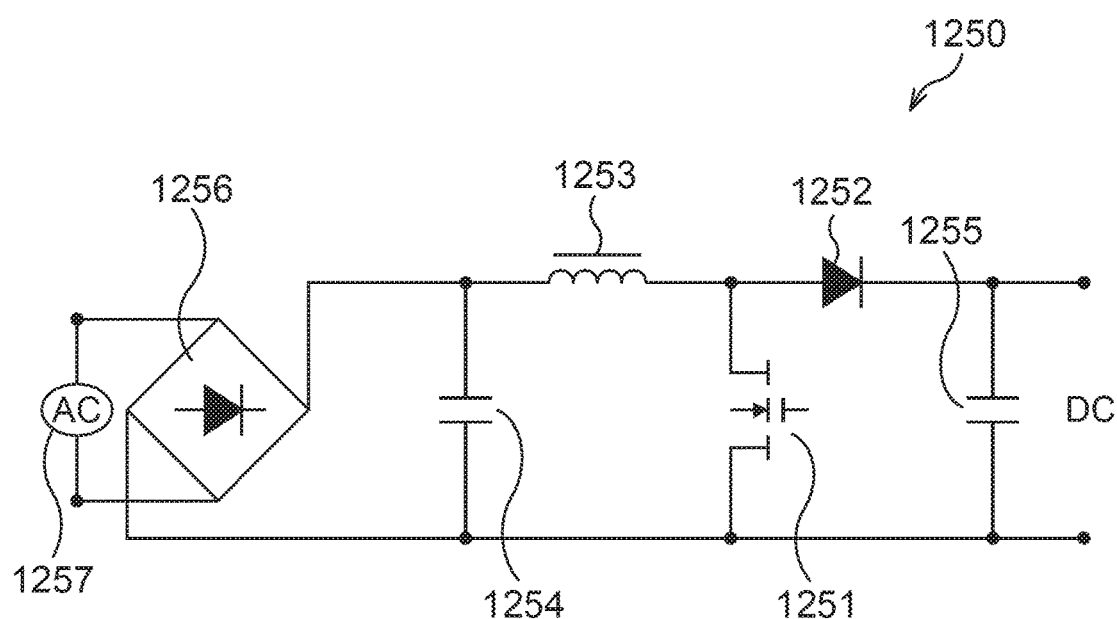
FIG. 8 is a wiring diagram illustrating a PFC circuit according to a sixth embodiment.

Next, a sixth embodiment is described. The sixth embodiment relates to a PFC (power factor correction) circuit equipped with a compound semiconductor device which includes a GaN-based HEMT. FIG. 8 is a wiring diagram illustrating the PFC circuit according to the sixth embodiment.

A PFC circuit 1250 has a switching element (transistor) 1251, a diode 1252, a choke coil 1253, capacitors 1254 and 1255, a diode bridge 1256, and an AC power source (AC) 1257. The drain electrode of the switching element 1251, the anode terminal of the diode 1252, and one terminal of the choke coil 1253 are connected with each other. The source electrode of the switching element 1251, one terminal of the capacitor 1254, and one terminal of the capacitor 1255 are connected with each other. The other terminal of the capacitor 1254 and the other terminal of the choke coil 1253 are connected with each other. The other terminal of the capacitor 1255 and the cathode terminal of the diode 1252 are connected with each other. A gate driver is connected to the gate electrode of the switching element 1251. The AC 1257 is connected between both terminals of the capacitor 1254 via the diode bridge 1256. A DC power source (DC) is connected between both terminals of the capacitor 1255. In the embodiment, the compound semiconductor device according to any one of the first to third embodiments is used as the switching element 1251.

In the method of manufacturing the PFC circuit 1250, for example, the switching element 1251 is connected to the diode 1252, the choke coil 1253 and so forth with solder, for example.

(Seventh Embodiment)

Figure 9:
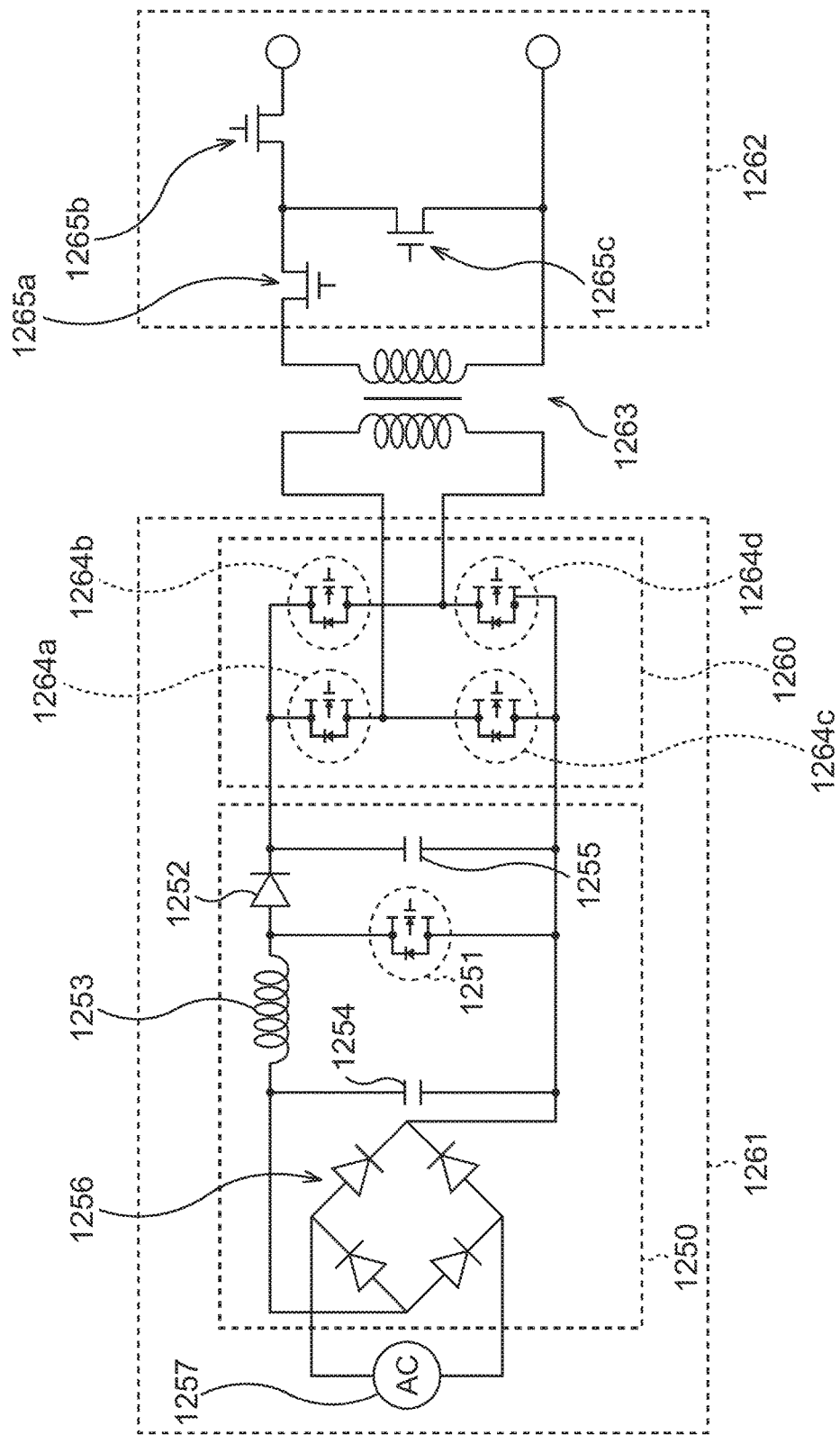
FIG. 9 is a wiring diagram illustrating a power supply apparatus according to a seventh embodiment.

Next, a seventh embodiment is described. The seventh embodiment relates to a power supply apparatus equipped with a compound semiconductor device which includes a GaN-based HEMT. FIG. 9 is a wiring diagram illustrating the power supply apparatus according to the seventh embodiment.

The power supply apparatus includes a high-voltage, primary-side circuit 1261, a low-voltage, secondary-side circuit 1262, and a transformer 1263 arranged between the primary-side circuit 1261 and the secondary-side circuit 1262.

The primary-side circuit 1261 includes the PFC circuit 1250 according to the sixth embodiment, and an inverter circuit, which may be a full-bridge inverter circuit 1260, for example, connected between both terminals of the capacitor 1255 in the PFC circuit 1250. The full-bridge inverter circuit 1260 includes a plurality of (four, in the embodiment) switching elements 1264a, 1264b, 1264c and 1264d.

The secondary-side circuit 1262 includes a plurality of (three, in the embodiment) switching elements 1265a, 1265b and 1265c.

In the embodiment, the compound semiconductor device according to any one of first to third embodiments is used for the switching element 1251 of the PFC circuit 1250, and for the switching elements 1264a, 1264b, 1264c and 1264d of the full-bridge inverter circuit 1260. The PFC circuit 1250 and the full-bridge inverter circuit 1260 are components of the primary-side circuit 1261. On the other hand, a silicon-based general MIS-FET (field effect transistor) is used for the switching elements 1265a, 1265b and 1265c of the secondary-side circuit 1262.

(Eighth Embodiment)

Figure 10:
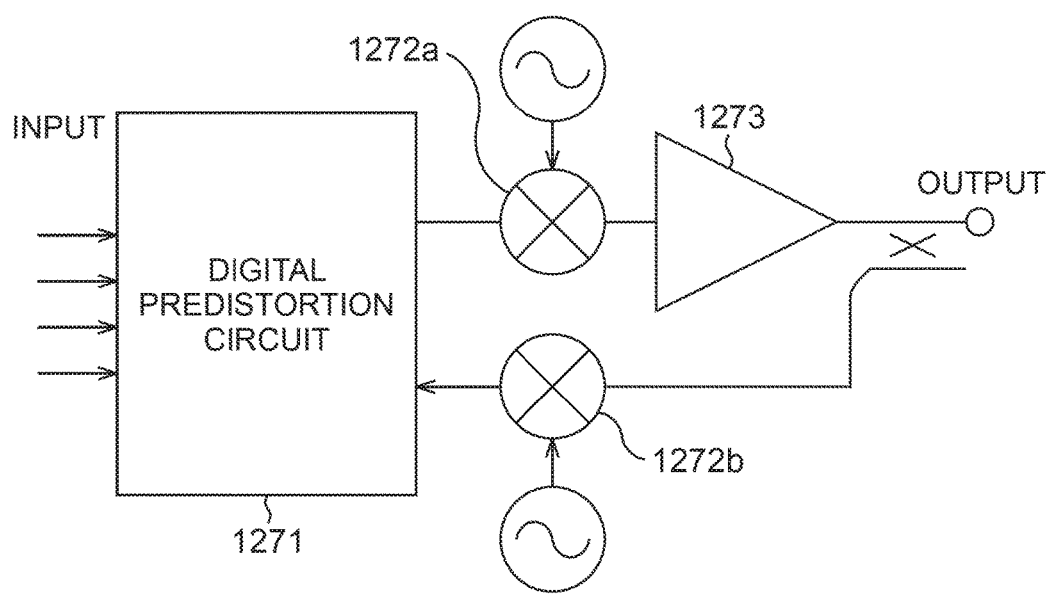
FIG. 10 is a wiring diagram illustrating an amplifier according to an eighth embodiment.

Next, an eighth embodiment is explained. The eighth embodiment relates to an amplifier equipped with the compound semiconductor device which includes a GaN-based HEMT. FIG. 10 is a wiring diagram illustrating the amplifier according to the eighth embodiment.

The amplifier includes a digital predistortion circuit 1271, mixers 1272a and 1272b, and a power amplifier 1273.

The digital predistortion circuit 1271 compensates non-linear distortion in input signals. The mixer 1272a mixes the input signal having the non-linear distortion already compensated, with an AC signal. The power amplifier 1273 includes the compound semiconductor device according to any one of the first to third embodiments, and amplifies the input signal mixed with the AC signal. In the embodiment, the signal on the output side may be mixed, upon switching, with an AC signal by the mixer 1272b, and may be sent back to the digital predistortion circuit 1271. The amplifier may be used as a high-frequency amplifier or a high-output amplifier.

According to the above-described compound semiconductor device and the like, since an appropriate impurity-containing region is included in the semiconductor substrate, it is possible to suppress a leak current between the drain electrode and the semiconductor substrate.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A method of manufacturing a compound semiconductor device comprising:
    forming an impurity-containing region containing impurities in a semiconductor substrate, the impurities being Fe, C, Au, or Mg, or combination thereof;
    forming an initial layer containing AlN over the semiconductor substrate;
    forming a channel layer over the initial layer;
    forming a carrier supply layer over the channel layer; and
    forming a gate electrode, a source electrode and a drain electrode over the carrier supply layer.

2. The method according to claim 1, wherein the semiconductor substrate is a silicon substrate or a silicon carbide substrate.

3. The method according to claim 1, wherein a level of the impurities is higher than an upper edge of a valence band of silicon by 0.25 eV or more.

4. The method according to claim 1, wherein a level of the impurities is lower than a lower edge of a conduction band of silicon by 0.25 eV or more, the level of the impurities being higher than an upper edge of a valence band of silicon.

5. The method according to claim 1, further comprising forming a buffer layer containing AlGaN between the semiconductor substrate and the channel layer.

6. The method according to claim 5, wherein the buffer layer is formed over an initial layer containing AlN, the initial layer formed between the semiconductor substrate and the channel layer.

7. The method according to claim 1, further comprising forming a superlattice buffer layer in which first nitride semiconductor layers and second nitride semiconductor layers are repeatedly stacked.

8. The method according to claim 7, wherein the superlattice buffer layer is formed over a buffer layer containing AlGaN, the buffer layer formed between the semiconductor substrate and the channel layer.

9. The method according to claim 7, wherein the first semiconductor layer contains AlN.

10. The method according to claim 9, wherein a thickness of the first semiconductor layer is 2 nm or less.

11. The method according to claim 7, wherein the second semiconductor layer contains AlGaN.

12. The method according to claim 7, wherein the first nitride semiconductor layers and the second nitride semiconductor layers are repeatedly stacked 80 periods in the superlattice buffer layer.

13. The method according to claim 1, wherein the initial layer contains the impurities.

14. The method according to claim 1, wherein the impurities exist at an interface between the semiconductor substrate and the initial layer.

15. The method according to claim 1, wherein an average impurity concentration is $1 \times 10^{18}$ cm$^{-3}$ or more in a region from an upper surface to a depth of 50 nm of the semiconductor substrate.

16. The method according to claim 1, wherein a carrier life time in the semiconductor substrate is $1 \times 10^{-9}$ seconds or less.

* * * * *